(12) United States Patent
Kobayashi et al.

(10) Patent No.: US 7,248,141 B2
(45) Date of Patent: Jul. 24, 2007

(54) CURRENT FUSE AND METHOD OF MAKING THE CURRENT FUSE

(75) Inventors: Satoru Kobayashi, Komagane (JP); Kazuyuki Kato, Minamiminowa-mura (JP)

(73) Assignee: Koa Kabushiki Kaisha, Ina-shi (JP)

( * ) Notice: Subject to any disclaimer, the term of this patent is extended or adjusted under 35 U.S.C. 154(b) by 346 days.

(21) Appl. No.: 10/883,032

(22) Filed: Jul. 2, 2004

(65) Prior Publication Data

US 2005/0035841 A1    Feb. 17, 2005

(30) Foreign Application Priority Data

Jul. 3, 2003    (JP)    ............... 2003-270614

(51) Int. Cl.
*H01H 85/143*    (2006.01)
*H01H 85/06*    (2006.01)

(52) U.S. Cl. ...................... 337/232; 337/231
(58) Field of Classification Search ............... 337/157, 337/231, 232
See application file for complete search history.

(56) References Cited

U.S. PATENT DOCUMENTS

| | | | |
|---|---|---|---|
| 2,864,733 A | | 12/1958 | Kranich |
| 5,429,882 A | | 7/1995 | Carey, II et al. |
| 5,516,484 A | * | 5/1996 | Kubosono et al. .......... 420/469 |
| 5,942,185 A | | 8/1999 | Nakatsuka et al. |
| 6,147,585 A | * | 11/2000 | Kalra et al. ................. 337/248 |
| 6,280,858 B1 | | 8/2001 | Teshima |
| 6,522,237 B1 | * | 2/2003 | Ito et al. .................... 338/22 R |
| 6,673,310 B2 | | 1/2004 | Tadauchi et al. |
| 2003/0196736 A1 | * | 10/2003 | Miyafuji .................... 148/684 |
| 2004/0091385 A1 | | 5/2004 | Leyendecker et al. |

FOREIGN PATENT DOCUMENTS

| | | | |
|---|---|---|---|
| DE | 100 45 991 A | | 4/2002 |
| JP | 54114428 A | * | 9/1979 |
| JP | 55-65341 A | | 5/1980 |
| JP | 56-69341 A | | 6/1981 |
| JP | 61174344 A | * | 8/1986 |
| JP | 01136944 A | * | 5/1989 |
| JP | 03191035 A | * | 8/1991 |

(Continued)

OTHER PUBLICATIONS

"Binary Alloy Phase Diagrams", Second Edition, p. 3417, vol. 3, ASM International, The Materials Information Society, USA.

(Continued)

*Primary Examiner*—Anatoly Vortman
(74) *Attorney, Agent, or Firm*—Smith Patent Office

(57) ABSTRACT

In order to provide a current fuse with high solderability without containing harmful materials, solder chips containing 30 to 60 percent by weight of zinc, 0.1 to 2 percent by weight of copper, 0.1 to 1 percent by weight of nickel, and the remainder percent by weight being tin, or further containing 0.01 to 0.5 percent by weight of aluminum are inserted into the interior of the electrodes before pressing the electrodes into the ends of the substrate of the fuse, the exterior of the electrodes is heated to melt the solder chips, thereby connecting between the electrodes and the fuse wire.

4 Claims, 6 Drawing Sheets

FOREIGN PATENT DOCUMENTS

| | | | |
|---|---|---|---|
| JP | 03199357 A | * | 8/1991 |
| JP | 6-79494 A | | 3/1994 |
| JP | 6-256922 A | | 9/1994 |
| JP | 7-96386 A | | 4/1995 |
| JP | 8-162000 A | | 6/1996 |
| JP | 8-222117 A | | 8/1996 |
| JP | 9-94688 A | | 4/1997 |
| JP | 11-172352 A | | 6/1999 |
| JP | 11-172353 A | | 6/1999 |
| JP | 2000-15478 A | | 1/2000 |
| JP | 2001-121285 A | | 5/2001 |
| JP | 2001-321983 A | | 11/2001 |
| JP | 2003-126988 A | | 5/2003 |

OTHER PUBLICATIONS

Brorson et al., "Overview of Solders and Brazes with Reduced Environmental Loading", May 1996, p. 37, AFR Report, Swedish Environmental Protection Agency, Stockholm, Sweden.

* cited by examiner

| COMPOSITION (wt%) | Zn | Cu | Ni | Al | Sn | EVALUATION |
|---|---|---|---|---|---|---|
| SAMPLE 1 OF EMBODIMENT | 40 | 0.1 | — | — | REMAINDER | OK, PROCESSABILITY AND WETTABILITY ARE IMPROVED |
| SAMPLE 2 OF EMBODIMENT | 40 | 2 | — | — | REMAINDER | OK, PROCESSABILITY AND WETTABILITY ARE IMPROVED |
| COMPARATIVE EXAMPLE 1 | 40 | 3 | — | — | REMAINDER | HIGH MELTING POINT AND SOLDER MANUFACTURABILITY FAIL |
| SAMPLE 3 OF EMBODIMENT | 40 | — | 0.1 | — | REMAINDER | OK |
| SAMPLE 4 OF EMBODIMENT | 40 | — | 1 | — | REMAINDER | OK |
| COMPARATIVE EXAMPLE 2 | 40 | — | 2 | — | REMAINDER | HIGH MELTING POINT AND SOLDER MANUFACTURABILITY FAIL |
| SAMPLE 5 OF EMBODIMENT | 40 | 1 | 0.5 | — | REMAINDER | OK |
| SAMPLE 6 OF EMBODIMENT | 40 | 1 | — | 0.01 | REMAINDER | OK |
| SAMPLE 7 OF EMBODIMENT | 40 | 1 | — | 0.5 | REMAINDER | OK |
| COMPARATIVE EXAMPLE 3 | 40 | 1 | — | 1 | REMAINDER | HEAT RESISTANCE AND PROCESSABILITY FAIL |
| SAMPLE 8 OF EMBODIMENT | 40 | — | 0.5 | 0.01 | REMAINDER | OK |
| SAMPLE 9 OF EMBODIMENT | 40 | 1 | 0.5 | 0.01 | REMAINDER | OK |
| SAMPLE 10 OF EMBODIMENT | 40 | — | — | — | REMAINDER | OK |

FIG. 6

CURRENT FUSE AND METHOD OF MAKING THE CURRENT FUSE

BACKGROUND OF THE INVENTION

1. Field of the Invention

The present invention relates to a lead-free current fuse, which is suitable for electronic equipment and electronic components, for example, and a method of making the current fuse.

2. Description of the Related Art

Various kinds of compact fuses, which are surface-mountable on a printed circuit board or the like, have been proposed. For example, a fuse in which a fuse element stretches in a hollow space within a rectangular case formed by attaching a ceramic casing main body and a lid has been disclosed in Japanese Patent Application Laid-Open No. 8-222117.

In the case of this compact fuse, a fuse element and tin-lead solder, which has been adhered to the interior of metallic cap in advance, are soldered.

On the other hand, tin-lead solder is essential for fabricating or assembling electronic equipment; however, it contains lead which is harmful to the human body and the like. Therefore, solder not containing harmful lead is desired by electronic equipment industries or related industries, and various kinds of lead-free solder have been proposed. For example, a lead-free solder alloy containing 7 to 10 percent by weight of zinc (Zn), 0.01 to 1 percent by weight of nickel (Ni), and the balance consisting of tin (Sn) has been described in Japanese Patent Application Laid-Open No. 9-94688.

On the other hand, a solder material that has been disclosed in Japanese Patent Application Laid-Open No. 2000-15478 is developed considering environmental issues after discarding electronic equipment, and is a lead-free solder material containing tin, 3 to 18 percent by weight of zinc in proportion to that tin and a small amount of additives (e.g., nickel).

However, when solder containing 10 percent by weight of tin and 90 percent by weight of lead is used to manufacture the fuse described in Japanese Patent Application Laid-Open No. 8-222117, a ceramic substrate absorbs heat generated when that solder melts. Therefore, a temperature to heat metallic caps must be set at approximately 400 degrees C., which is approximately 100 degrees C. higher than the melting point of solder.

Such temperature degrades plating on the surface of metallic caps, resulting in deterioration of solderability when mounting a fuse on a substrate.

On the other hand, the above-described lead-free tin-zinc-nickel solder is used for mounting a fuse on a substrate. That solder used in the interior of component causes a problem of deterioration of quality, such as break of a fuse element when the solder within each component melts in a reflow process when mounting the fuse on the substrate.

SUMMARY OF THE INVENTION

The present invention has been developed in view of the above-described problems, and aims to provide a current fuse, which has solderability suitable for electronic equipment and electronic components, and does not have an adverse influence on the environment including the human body, and a method of manufacturing the current fuse.

The present invention has a configuration to achieve the above-described objectives. In other words, a current fuse includes a fuse wire and electrodes which are soldered using lead-free solder, wherein the lead-free solder contains at least 30 to 60 percent by weight of zinc, 0.1 to 2 percent by weight of copper, and the remainder percent by weight of tin.

Furthermore, a current fuse includes a fuse wire and electrodes which are soldered using lead-free solder, wherein the lead-free solder contains at least 30 to 60 percent by weight of zinc, 0.1 to 1 percent by weight of nickel, and the remainder percent by weight of tin.

Furthermore, a current fuse includes a fuse wire and electrodes which are soldered using lead-free solder, wherein the lead-free solder contains at least 30 to 60 percent by weight of zinc, 0.1 to 2 percent by weight of copper, 0.1 to 1 percent by weight of nickel, and the remainder percent by weight of tin.

Furthermore, a current fuse includes a fuse wire and electrodes which are soldered using lead-free solder, wherein the lead-free solder having any one of the above-described composition further contains 0.01 to 0.5 percent by weight of aluminum.

Furthermore, a current fuse, including: a fuse wire; a container for the fuse wire; and cap electrodes that are attached to both ends of the container; wherein the fuse wire is soldered to the electrodes using lead-free solder that is provided in the interior of the electrodes, and the lead-free solder has any one of the above-described compositions.

Even further, a current fuse includes a fuse wire and electrodes which are soldered using lead-free solder, wherein the lead-free solder contains at least 30 to 60 percent by weight of zinc and the remainder percent by weight of copper and tin.

In addition, when manufacturing a current fuse, a fuse wire and electrodes are soldered using lead-free solder at a temperature between a solid phase temperature and a liquid phase temperature of the lead-free solder. Alternatively, a fuse wire and electrodes are soldered in an atmosphere of oxygen using lead-free solder.

BRIEF DESCRIPTION OF THE DRAWINGS

FIG. 6 is a table showing the evaluation results from changing the content ratios of copper, nickel, and aluminum included in tin-zinc solder according to the embodiment.

DETAILED DESCRIPTION OF THE INVENTION

Figure 1:
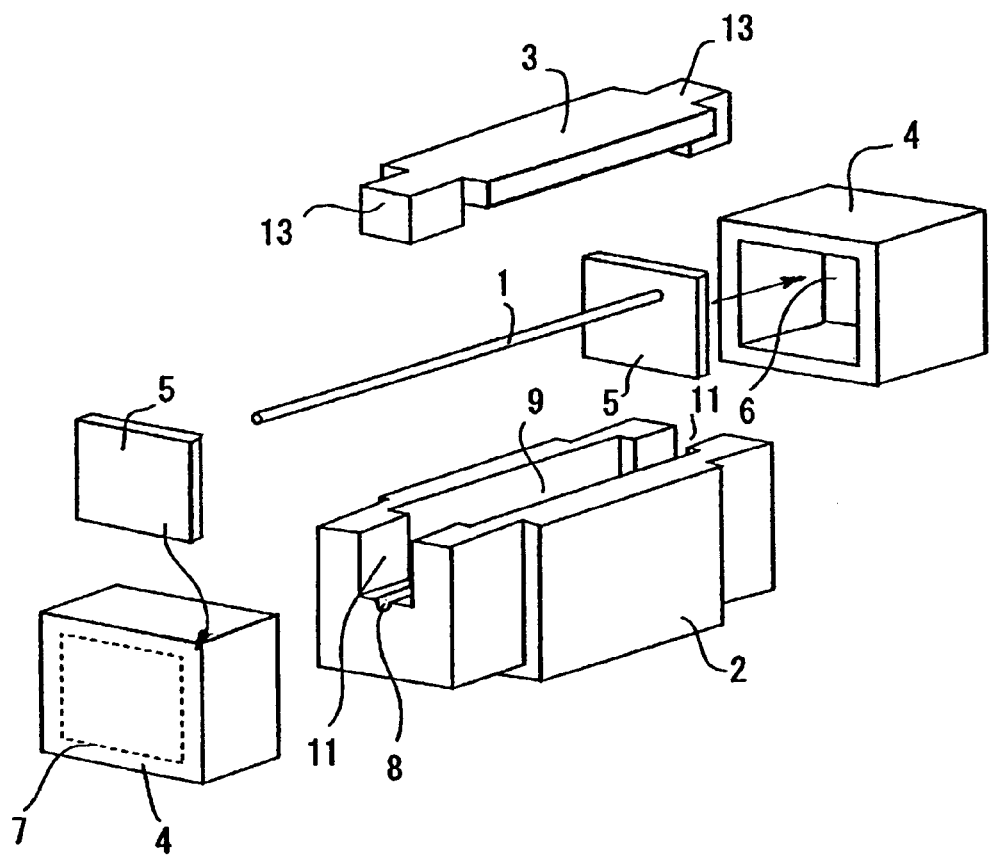
FIG. 1 is an exploded view of a chip-type fuse according to an embodiment of the present invention.

An embodiment of the present invention is described in detail forthwith while referencing the attached drawings. FIG. 1 is an exploded block diagram of a chip-type fuse according to the embodiment of the present invention. The chip-type fuse shown in the drawing is configured by stretching a fuse in a hollow space of a ceramic substrate. This substrate is formed by attaching a ceramic lid 3 to a ceramic casing main body 2.

At the center of the casing main body 2, an opening 9 which is opening upward is provided. At both ends of the casing main body 2, concave portions 11 communicating with that opening 9 are provided.

On the respective bottoms of the concave portions 11, a single-thread groove 8 is formed. A soluble fuse wire (fuse element) 1 is aligned with this groove 8, and stretching across the opening 9.

Note that when stretching the fuse wire 1 between the concave portions 11, a constant tension is applied to that fuse wire 1. In this case, the fuse wire 1 may be temporarily attached to the groove 8 using a resin or the like in order to maintain that tension.

In this way, the lid 3 is attached to the opening 9 in the casing main body 2 in which the fuse wire 1 stretches. Both ends 13 of that lid 3 are shaped so as to fit in the concave portions 11 (the widths and the depths of the ends 13 are slightly smaller than those of the concave portions 11). In addition, the center of the lid 3 almost completely covers the opening 9 (the length and the width of the center of the lid 3 are slightly smaller than those of the opening 9).

Figure 2:
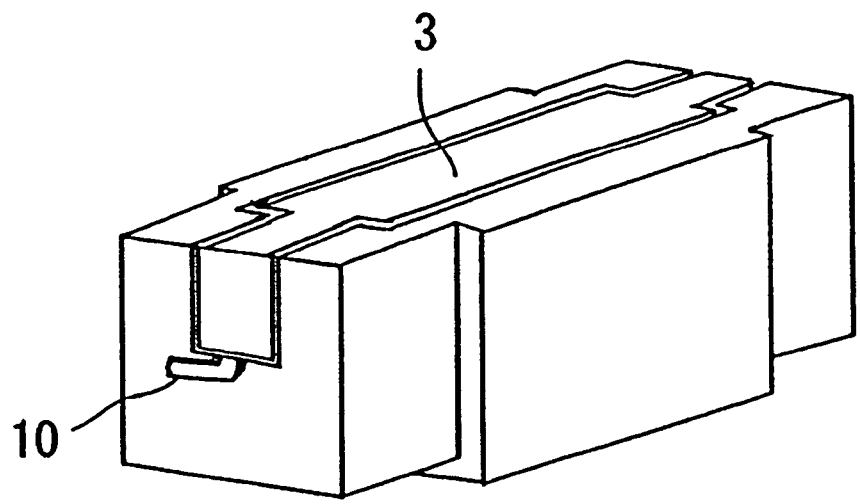
FIG. 2 is an external view of a current fuse, which has a substrate formed by combining a casing main body and a lid according to the embodiment.

In this way, the exterior of the substrate formed by combining the casing main body 2 and the lid 3 is almost rectangular. The exterior of the fuse in this case is shown in FIG. 2. As shown in FIG. 2, when the casing main body 2 and the lid 3 are combined, a bent portion 10 of the fuse wire 1 protrudes from each end of the substrate, respectively. That bent portion 10 is connected to a metallic cap as described later.

Each of metallic caps (electrodes) 4 is made of copper or a copper alloy, for example, and has a shape where one side (which faces the substrate) of a cube is opened so as to cap the end of the substrate as shown in FIG. 2. In addition, solder chips 5, each having a composition to be described later, are inserted into the respective interiors 6 of the electrodes 4 before capping the ends of the substrate with the electrodes 4 (see FIG. 1). The electrodes 4 into which the solder chips 5 are inserted, respectively, then cap both ends of the substrate (by pressing in and attaching).

Note that not only solder chips may be provided to the interior 6 of each electrode 4, but molten solder or creamy solder may alternatively be provided to the caps.

Figure 3:
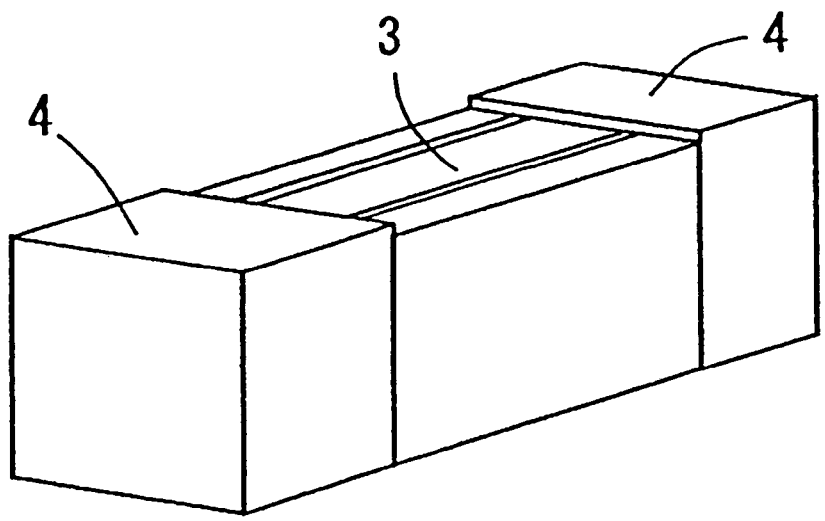
FIG. 3 is an external view of a current fuse when covered by electrodes according to the embodiment.

FIG. 3 shows the exterior of the fuse over which the electrodes 4 are fit as described above. As shown in FIG. 1, a portion (heating position) 7 indicated by a dashed line in the electrode 4 of the above-described fuse is heated using a heater, for example, at a temperature of 350 degrees C. for approximately three seconds to melt the solder chip 5, which has been inserted into the interior of the electrode 4 in advance.

As a result, the solder chips 5 are soldered (fusion bonded) to the above-described bent portions 10 of the fuse wire 1, resulting in an electrical connection between the fuse wire 1 and the electrodes 4.

As described above, the casing main body 2 and the lid 3 of the chip-type fuse according to the embodiment are formed so that the outer dimensions of the lid 3 are slightly smaller than the internal dimensions of the casing main body 2. This facilitates alignment therewith. More specifically, they are attached by inserting the lid 3 perpendicularly to the casing main body 2 during assembling.

As a result, when the casing main body 2 and the lid 3 are attached, the ends 13 of the lid 3 never protrude from the concave portions 11 of the casing main body 2. This allows smooth pressing in and attaching of the electrodes 4 to the ends of the substrate, and establishment of electrical connections between the fuse wire 1 and the electrodes 4.

Note that the lid 3 is attached to the casing main body 2 by bonding them together with an adhesive such as an epoxy and heating at a given temperature for a given period of time (e.g., at a temperature of 150 degrees C. for approximately 15 minutes). The electrodes 4 are pressed in and attached after the adhesive has hardened.

In addition, the electrodes 4 of the chip-type fuse according to the embodiment are also soldered to land patterns on a printed circuit board when mounting the fuse on the board. Subsequently, to facilitate and secure soldering to the printed circuit board when the fuse is mounted on that board, although not shown in the drawing, the electrodes 4 are formed, for example, so that one of the four sides of the pressed in and attached electrodes 4 protrudes from the sides of the substrate of the chip-type fuse for just the thicknesses of the electrodes 4. The other three sides of the electrodes 4 are aligned with, that is, in plane with the sides of the substrate of the chip-type fuse.

In this way, aligning the sides of the electrodes 4 with those of the substrate and flattening them facilitates usage of a vacuum chuck when mounting the chip-type fuse on the printed circuit board, and also facilitates setting a seal on the fuse main body.

Next, a solder chip used for the chip-type fuse according to the embodiment is described in detail.

In the case of the fuse according to the embodiment, high temperature tin-zinc type solder is used as a solder chip to connect the fuse wire. Heat resistance (rate of change in the resistance value) of solder, which contains 30 to 60 percent by weight of zinc (Zn) considered to be an appropriate percentage of zinc content, is measured. The exemplary measurement results are shown in FIG. 4.

Figure 4:
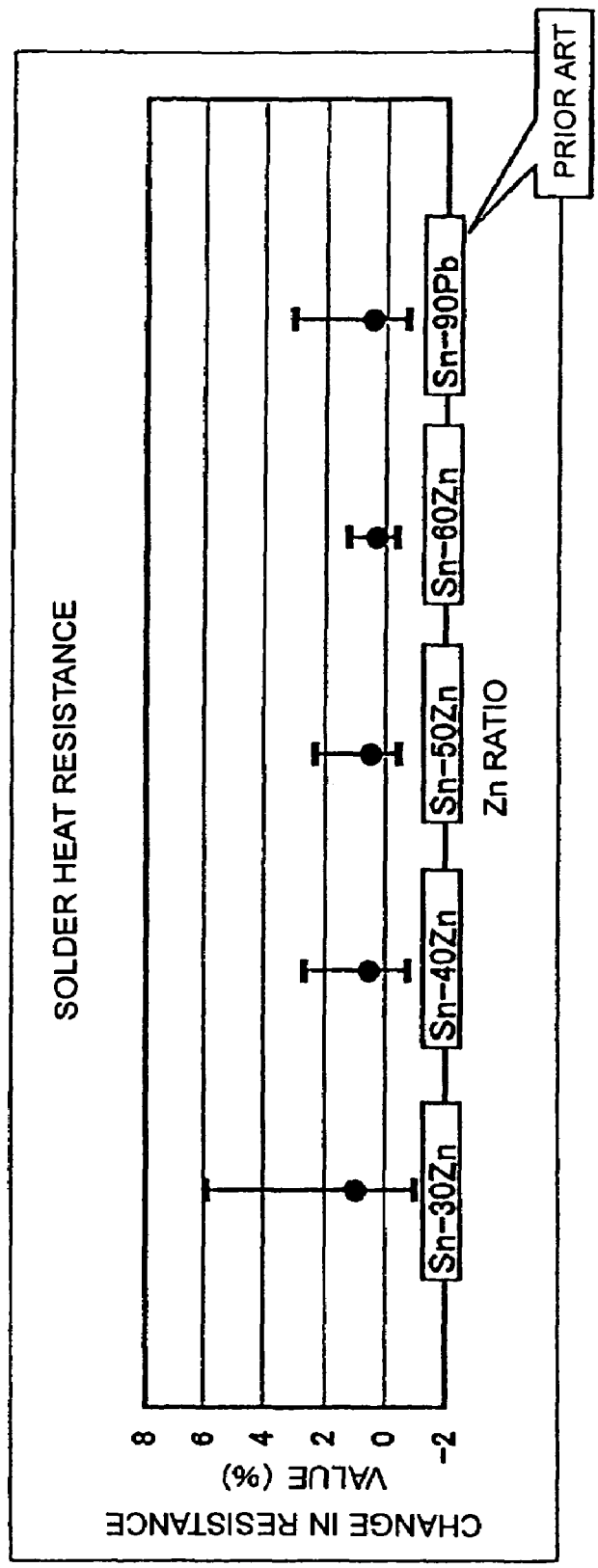
FIG. 4 is a graph showing a comparison of changes in resistance value of a fuse using tin-zinc type solder when changing the zinc content ratio according to the embodiment.

Note that a characteristic of the conventional tin-lead solder (containing 90 percent by weight of lead) is shown on the far-right portion of FIG. 4 for comparison. In FIG. 4, numerals preceding Zn are percentages of zinc (Zn) content.

The higher the ratio of zinc (Zn) than tin (Sn), the higher the melting point, resulting in improvement in solder heat resistance. However, too much zinc (Zn) leads to difficulty in working. On the other hand, shortage of zinc (Zn) leads to high fluidity and deterioration of solder heat resistance.

As shown in FIG. 4, even considering the above-mentioned conditions, high temperature tin-zinc type solder containing 30 to 60 percent by weight of zinc is available.

More specifically, lead-free solder containing 30 to 60 percent by weight of zinc, 0.1 to 2 percent by weight of copper, 0.1 to 1 percent by weight of nickel, and the balance consisting of tin is used.

Alternatively, lead-free solder containing 30 to 60 percent by weight of zinc, 0.1 to 2 percent by weight of copper, and the remainder being tin, or lead-free solder containing 30 to 60 percent by weight of zinc, 0.1 to 1 percent by weight of nickel, and the remainder being tin may be used.

In this way, inclusion of 30 to 60 percent by weight of zinc makes tin-zinc-nickel type solder or tin-zinc-copper type solder with a solid phase temperature of 199 degrees C. and a liquid phase temperature of 360 degrees C. or greater, which are preferable for a current fuse.

Incidentally, tin-zinc-nickel type solder and tin-zinc-copper type solder have fluidity when reheated in the reflow process for mounting the chip-type fuse on the printed circuit board. Therefore, expansion of air inside the chip-type fuse may cause malfunctions such as washing out the solder. Accordingly, fluidity of solder must be reduced.

Since specific gravity of aluminum is low, aluminum solidifies on the surface of a joint when it melts. In addition, since aluminum is easily oxidized, a solid oxide film is formed on the surface of the joint. Therefore, insulation of the fuse increases when becoming an open-circuit, resulting in an arc-suppressing operation.

In addition, since aluminum is effective in decreasing the fluidity of solder, 0.01 to 0.5 percent by weight of aluminum is added to solder in the present embodiment.

However, if the added amount of aluminum is less than 0.01 percent by weight, the influence on fluidity is small, resulting in no prescribed effectiveness. On the other hand, if the added amount of aluminum is greater than 0.5 percent by weight, conductivity decreases due to oxidation of aluminum when the solder is left in a high-temperature environment. From the above, with the embodiment, a very small added amount of aluminum, which is effective for fluidity, is used, and the amount of additive is determined based on the solder use conditions.

In this way, inclusion of 30 to 60 percent by weight of zinc leads to a preferable solid phase temperature for the current fuse. Alternatively, it is preferable that tin-zinc solder containing 40 percent by weight of zinc with characteristics such as heat resistance equivalent to those of the conventional tin-zinc solder is used. Therefore, in the current fuse of the embodiment, tin-zinc solder containing 40 percent by weight of zinc is used.

The evaluation results of various percentages of copper, nickel, and aluminum contents to be contained in that tin-zinc solder are shown in FIG. 6.

'Processability' in FIG. 6 means workability of inserting a solder joint into an electrode cap. Moderate flexibility is favorable because the solder joint fits to the interior of the electrode cap. In addition, 'solder manufacturability' means workability of manufacturing a joint by melting a solder material.

In addition, 'heat resistance' means change in resistance due to change in temperature; and 'wettability' means adherability of solder to a bonding target. Poor wettability causes solder to peel off of the surface of the bonding target.

Figure 5:
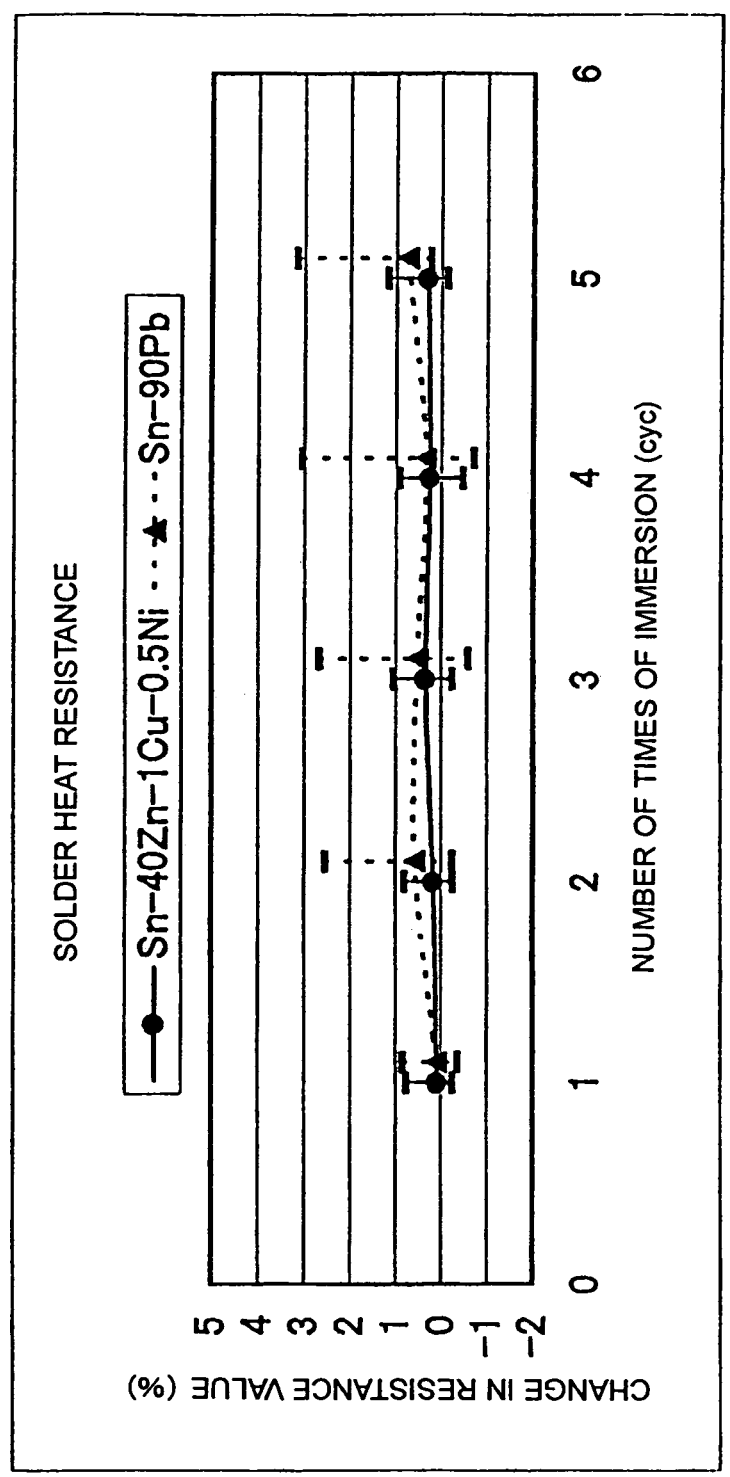
FIG. 5 is a graph showing a comparison of changes in resistance value of a fuse using conventional solder and a fuse using solder according to the embodiment.

FIG. 5 is a graph showing the results of comparing the changes in the resistance value of a fuse in which a conventional solder is used and changes in the resistance value of a fuse in which a solder according to the embodiment is used. A performance test is carried out for the solder according to the embodiment, which contains 40 percent by weight of zinc, 1 percent by weight of copper, 0.5 percent by weight of nickel, and the balance consisting of tin, and conventional solder, which contains 10 percent by weight of tin and 90 percent by weight of lead.

Note that the rate of change in the resistance value is examined under the conditions of immersion in molten solder at a temperature of 260 degrees C. for ten seconds repeated five times. As is seen from FIG. 5, in the case of the fuse using solder according to the embodiment, the rate of change in the resistance value is 2% or less at most. This is a characteristic almost equivalent to that of the fuse using the conventional solder containing lead (indicated by a dashed line in the drawing).

Such characteristic can be obtained based on the following reasons. In short, the solder according to the embodiment has low fluidity in a solid-liquid coexistence state. Therefore, even if the solder is heated when the fuse is mounted on the printed circuit board, the shape of solder (joint) connecting the fuse and the electrode does not change, and the connection is maintained.

This is because the solder according to the embodiment being soldered in an atmosphere of oxygen steadily oxidizes the surface thereof due to heat generated during soldering, and forms a solid oxide film, resulting in decrease in fluidity thereof.

In addition, since the solder joint according to the embodiment can never be exposed to oxygen due to a special flux, progression of oxidation of the solder joint after being soldered stops. This is one reason why the above-mentioned characteristic can be obtained.

Figure 7:
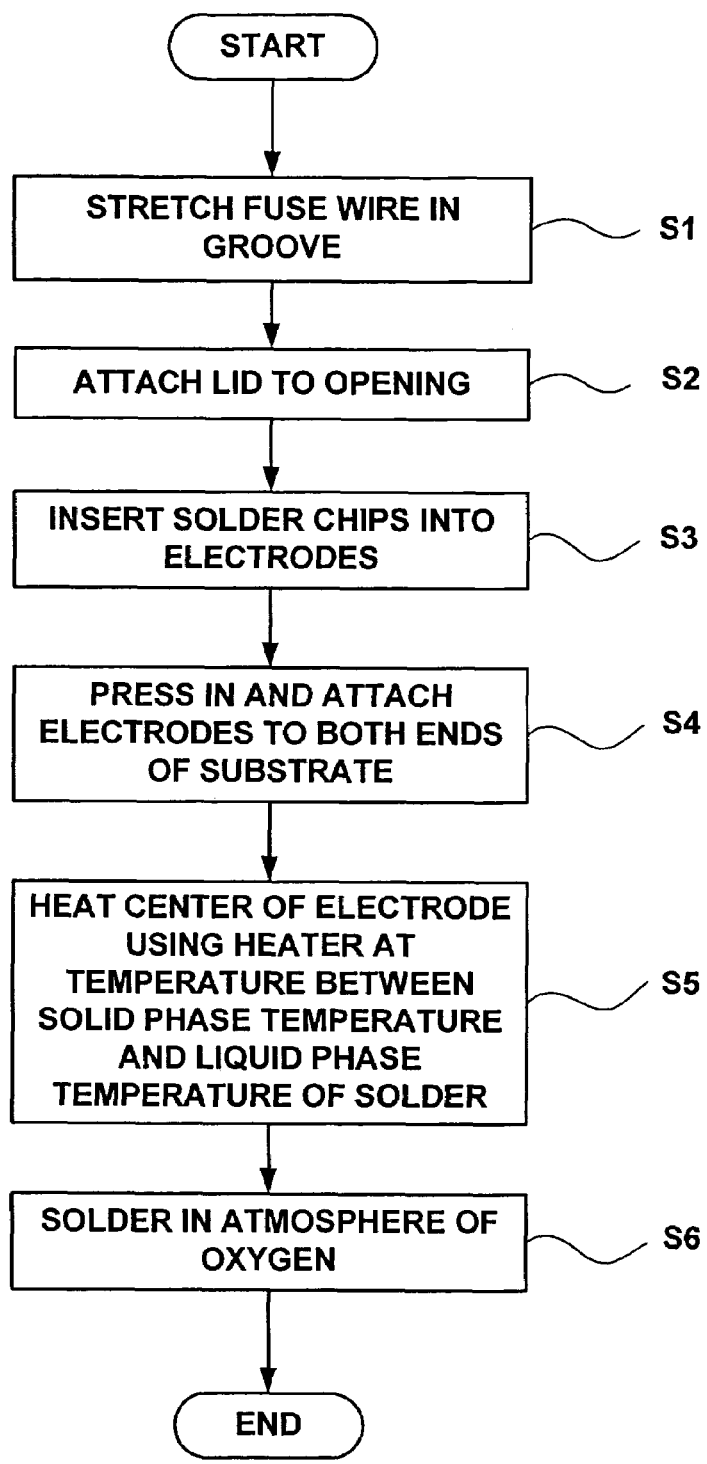
FIG. 7 is a flowchart describing the steps of making the current fuse according to the embodiment.

A method of manufacturing a current fuse with the above-mentioned configuration is described forthwith while referencing FIG. 7. FIG. 7 is a flowchart describing the steps of manufacturing the current fuse according to the embodiment.

To begin with, in step S1, the fuse wire 1 is aligned with the groove 8 at the bottoms of the concave portions 11 of the casing main body 2 and stretched across the opening 9. At this time, a certain tension may be applied to the fuse wire 1 in order to temporarily adhere to the groove 8 using an adhesive resin. This omits application of a certain tension after the temporary adhesion. Note that there may not be need to temporarily adhere or apply tension when providing the fuse wire in the groove 8 according to the shape of the fuse wire.

Next, in step S2, the lid 3 is attached to the opening 9, and the exposed ends of the fuse wire are bent. This makes the exterior of the current fuse shown in FIG. 2, in other words, the bent portions 10 of the fuse wire 1 protrude from the ends of the substrate. Note that in this case, the lid 3 and the casing main body 2 are bonded together with an adhesive, and the adhesive is hardened by heating at a given temperature for a given period of time (e.g., at a temperature of 150 degrees C. for approximately 15 minutes).

Next, in step S3, the solder chips 5 with the above-mentioned composition are aligned and inserted into the interior 6 of the respective metallic caps (electrodes) 4 so as to cover the bent portions 10 of the fuse wire 1, respectively, when the electrodes 4 are fit over the substrate.

In addition, in step S4, the electrodes 4 into which the solder chips 5 are inserted, respectively, are then pressed into and attached to both ends of the substrate. At this time, it is desirable that the solder chips 5 are provided at the bent portions 10. The exterior of the fuse over which the electrodes 4 are fit as described above is shown in FIG. 3.

Next, in step S5, the center portion (indicated by a dashed line 7 in FIG. 1) of each electrode 4 is heated by a heater at a temperature between a solder solid phase temperature and a solder liquid phase temperature, for example, at a temperature of 350 degrees C. for approximately 3 seconds. This melts the solder chips 5 which have been inserted into the electrodes 4 in advance.

As a result, the solder chips 5 are soldered (fusion bonded) to the above-described bent portions 10 of the fuse wire 1, and the fuse wire 1 and the electrodes 4 are soldered in an atmosphere of oxygen, resulting in establishment of an electrical connection therebetween (in step S6).

Note that the lid 3 is attached to the casing main body 2 by bonding together with an adhesive such as an epoxy, and heating at a given temperature for a given period of time (e.g., at a temperature of 150 degrees C. for approximately 15 minutes). The electrodes 4 are pressed in and attached after the adhesive has hardened.

As described above, according to the embodiment, connection between electrodes and a fuse wire can be secured by inserting a solder chip into the interior of each electrode in advance before pressing the electrodes into the ends of the substrate of the fuse, and then heating the exterior of the electrodes to melt the solder, and keeping a good electrical joint condition at the junctions thereof.

In addition, usage of tin-zinc-nickel type solder that does not contain harmful materials such as lead as the solder chip to be inserted into the interior of each electrode for connection with the fuse line, not only prevents adverse influence on the environment and human health and also adverse influence on other electronic components to be mounted together with the current fuse, but also allows to maintain the internal condition of the current fuse even if overheated when the fuse is mounted on the printed circuit board.

Furthermore, addition of aluminum as a solder alloy material improves heat resistance and fluidity of solder, resulting in improvement of solderability, and prevention of change in the shape of the solder joint due to reheating.

In addition, the fuse according to the embodiment allows a sufficient joint between the electrode and the fuse wire by heating the electrode at a temperature of 350 degrees C. As a result, soldering is completed at a temperature less than the liquid phase temperature even with consideration for heat radiation from the ceramic substrate. Accordingly, soldering is possible even in a solid-liquid coexistence state at a temperature between the solid phase temperature and the liquid phase temperature, thereby preventing degradation of plating on the surface of the electrode.

Unavoidable impurities specified by Japanese Industrial Standards (JIS) may be included in the composition of the lead-free solder described above. However, even the case of such unavoidable impurities being contained in the lead-free solder does not depart from the scope of the appended claims of the present invention.

As described above, the present invention provides a current fuse, which does not have an adverse influence on the environment due to harmful materials, and has excellent characteristics such as solderability on a printed circuit board, and a method of making the same.

While the invention has been described with reference to particular embodiments, further modifications and improvements which will occur to those skilled in the art, may be made within the purview of the appended claims, without departing from the scope of the invention in its broader aspect.

What is claimed is:

1. A current fuse comprising a fuse wire and electrodes, said fuse wire being connected to said electrodes by a lead-free solder, wherein
    said lead-free solder comprising at least 30 to 60 percent by weight of zinc, 0.1 to 2 percent by weight of copper, 0.1 to 1 percent by weight of nickel, with the remainder percent by weight being tin.

2. The current fuse according to claim 1, wherein said lead-free solder further contains 0.01 to 0.5 percent by weight of aluminum.

3. A current fuse, comprising:
    a fuse wire;
    a container for said fuse wire;
    cap electrodes that are disposed on both ends of said container; and
    a lead-free solder is disposed between said fuse wire and said cap electrodes, and
    said lead-free solder comprising at least 30 to 60 percent by weight of zinc, 0.1 to 2 percent by weight of copper, 0.1 to 1 percent by weight of nickel, with the remainder percent by weight being tin.

4. The current fuse according to claim 3, wherein said lead-free solder further contains 0.01 to 0.5 percent by weight of aluminum.

* * * * *